(12) United States Patent
Weekamp et al.

(10) Patent No.: US 7,105,922 B2
(45) Date of Patent: Sep. 12, 2006

(54) ELECTRODE-TYPE HEAT SINK

(75) Inventors: Johannus Wilhelmus Weekamp, Eindhoven (NL); Marc Andre De Samber, Eindhoven (NL); Durandus Kornelius Dijken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 11 days.

(21) Appl. No.: 11/065,564

(22) Filed: Feb. 24, 2005

(65) Prior Publication Data

US 2005/0140000 A1 Jun. 30, 2005

Related U.S. Application Data

(62) Division of application No. 10/480,113, filed as application No. PCT/IB02/02305 on Jun. 17, 2002, now Pat. No. 6,878,573.

(30) Foreign Application Priority Data

Jun. 19, 2001 (EP) .................................. 01202370

(51) Int. Cl.
*H01L 23/34* (2006.01)
(52) U.S. Cl. ................ 257/712; 257/719; 257/E23.109
(58) Field of Classification Search ................ 257/712, 257/719
See application file for complete search history.

(56) References Cited

U.S. PATENT DOCUMENTS 6,602,737 B1* 8/2003 Wu ............................. 438/122

6,625,026 B1* 9/2003 Boudreaux et al. ......... 361/705
6,946,730 B1* 9/2005 Teshima ..................... 257/718

FOREIGN PATENT DOCUMENTS

EP          0920058     6/1999
JP          A09027591   1/1997

* cited by examiner

*Primary Examiner*—W. David Coleman
(74) *Attorney, Agent, or Firm*—Aaron Waxler

(57) ABSTRACT

The invention relates to a method of manufacturing a semiconductor device (10), wherein a semiconductor element (1) provided with a number of connection regions (2) is fitted between a first, electroconductive plate (3) and a second plate (4), wherein two connection conductors (3A, 3B) are formed, from the first plate (3), for the two connection regions (2A, 2B) of the element (1), wherein a passivating encapsulation (5) is provided between the plates (3, 4) and around the element (1), and wherein the device (10) is formed by applying a mechanical separating technique in two mutually perpendicular directions (L, M).

Figure 1:
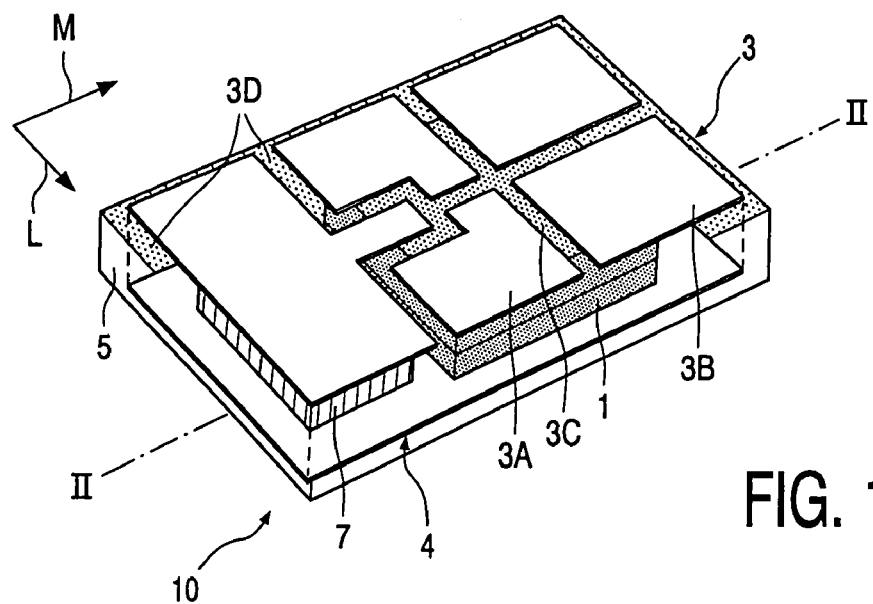

In a method according to the invention, the connection conductors (3A, 3B) are formed by providing a mask (6) on the first conducting plate (3) in such a manner that a part (3C) of the plate (3) situated between the connection regions (2A, 2B) remains exposed, which part is subsequently removed by etching. Such a method enables a very compact discrete or at least semi-discrete semiconductor device (10) to be readily obtained at low cost, while a high yield is achieved. In a preferred embodiment, also further parts (3D) of the conducting plate (3) situated at the location where the device (10) is to be sawn, cut or broken remain uncovered by the mask (6) and are removed during etching.

2 Claims, 2 Drawing Sheets

ELECTRODE-TYPE HEAT SINK

This is a Divisional of application Ser. No. 10/480,113, filed Dec. 9, 2003 now U.S. Pat. No. 6,878,573.

The invention relates to a method of manufacturing a semiconductor device comprising a semiconductor element provided with a number of connection regions, which method comprises the steps of:

arranging at least one semiconductor element between a first and second plate, which first plate is electrically conductive, and is electrically conductively connected to at least two connection regions of the semiconductor element;

providing a passivating encapsulation between the plates and around the semiconductor element;

forming at least two connection conductor from the first plate, such that at least one of those is connected to the at least one connection region of the semiconductor element and forming the semiconductor device by applying a mechanical separation technique along separation lines.

The invention also relates to a semiconductor device comprising a semiconductor element, that is provided with a number of connection regions and that is arranged between a first electrically conductive plate, and a second plate, which first plate is patterned into at least two connection conductors, at least one of which is connected to the at least one connection region of the semiconductor element, between which first and second plates and around the semiconductor element a passivating encapsulation is present.

Such a method is known from JP-A 09-027591. Said known document describes that two diodes are fitted between two conductive plates, the anodes of the diodes being electrically connected to one plate, and the cathodes to the other plate. After the diodes have been encapsulated in an electrically insulating synthetic resin envelope provided between the plates, individual devices, each comprising two diodes, are obtained by means of sawing in two mutually perpendicular directions along separation lines. Using the same technique, a groove is sawn in both plates between the diodes, which groove extends just into the synthetic resin envelope. In this manner a device comprising two parallel-connected diodes provided with connection conductors is obtained in a very simple and inexpensive manner.

A drawback of the known method resides in that it cannot adequately be used for more complex semiconductor elements, such as transistors and integrated circuits, preferably with a somewhat limited number of connection regions, or for more complex semiconductor devices incorporating one or several passive elements.

Therefor, it is a first object of the invention to provide enabling said drawback to be obviated, or at least reduced.

To achieve this, a method of the type mentioned in the opening paragraph is characterized in that in accordance with the invention in that the connection conductors are formed by providing a mask on the conductive first plate, such that a part of the conductive plate situated between the connection regions is left exposed after which said part is removed by means of etching.

The invention is based first of all on the recognition that, in this manner, comparatively complex devices comprising a somewhat larger number of connection regions can be readily provided with connection conductors. In particular, the geometry and position of the connection conductors can be chosen (more) freely, which frequently leads to better performance. The invention is further based on the recognition that parts of the conductive plate can be readily removed by etching if the thickness of the conductive plate is chosen to be sufficiently small, so that lateral-etching problems are limited even if a very inexpensive wet-chemical etching operation is carried out. In addition, in this process the synthetic resin envelope, if it has been provided before the connection conductors are formed, can very suitably be used as an etch-stop layer and as a protection of the semiconductor element. Moreover, the recognition that, in spite of the requested miniaturization of the device to be manufactured, the smallest lateral dimension may still be comparatively large plays a role.

In a preferred embodiment of a method in accordance with the invention, also the parts of the conductive plate where the semiconductor device is subjected to a separating operation are left exposed by the mask and are removed in the etching process. This has the very important advantage that the performance of the device obtained is further improved and the number of rejects reduced. After all, it has been found that many mechanical separation techniques, such as sawing, cutting or breaking give rise to various problems, on the synthetic resin envelope as well as on the conductive plate(s), such as the development of burrs, which may cause short-circuits and a higher percentage of rejects. By virtue of the measure proposed in the preferred embodiment, these problems do not occur, or to a much lesser extent, because the mechanical separation technique used essentially has to be applied to only one material. An important and surprising additional advantage of the invention resides in that, the measure proposed in this embodiment can be taken without additional measures: only the geometry of the mask used has to be adapted. As a result, the method remains comparatively simple and very economical.

As expounded hereinabove, the fact that the mask is formed by means of a photosensitive organic substance that is provided in the form of a solid foil on the conductive plate as well as the fact that for the etching process use is made of wet-chemical etching contributes to said method being comparatively simple and very economical. Also the use of two electroconductive plates has advantages, such as, inter alia, the possibility of connecting the rear side (=the substrate side) of a semiconductor element with the first conductive plate, so that devices suitable for final surface mounting can be obtained. In this case, preferably, also the parts of the second conductive plate are removed at the location where the device is sawn through.

Preferably, the thickness of the plates is chosen to range between 2 and 40 µm. The best results are achieved if the plates are equally thick. This has the advantage that the effect of forces, resulting from shrinkage of the synthetic resin envelope, exerted on the device is symmetrical. This means that the deformation of the plates caused by said forces is minimal and the adverse effect of said deformation during masking the plates is also minimal.

Very good results are achieved by using copper as the material for the conductive plates. Advantageously, next to the semiconductor element an electroconductive body is fitted between the plates so as to enhance the above-mentioned surface mountability. Such an electroconductive body is provided, preferably in the same way as and concurrently with the semiconductor element, with a further connection conductor that is formed from the first conductive plate.

Laser welding is a particularly attractive, i.e. inexpensive way of securing the conductive plate, in particular the first plate, to the semiconductor element. The first conductive plate is preferably provided with a solder-resist layer, so that a device obtained can suitably be mounted on a printed circuit board by means of soldering.

In a further embodiment, the second plate is provided with a first part extending next to the semiconductor element, which is bended after separation of the plate, such that it contacts the first plate. In this embodiment, the second plate is electrically conducting and attached with a suitable glue to the semiconductor element. The second plate herein acts as a heat sink, and optionally as a lead. This embodiment is very suitable for power transistors. It may be that the semiconductor device is provided with a first bended part only, but alternatively there may be two or more bended parts.

This embodiment is manufactured in that the semiconductor element the first plate is removed next to the semiconductor element. This is preferably done in the same patterning step in which the connection conductors are defined. The encapsulation material is then removed locally, next to the semiconductor element, for instance with grinding. In this operation it is assured that the encapsulation is kept around the semiconductor element. It is preferred, that the semiconductor devices are separated after this grinding step. Finally the second plate is bended. It is herein preferred that the second plate is provided with a mechanical support.

The semiconductor device provided in this way has a size of 1.0*0.6*0.5 mm for instance, and the first plate is of copper with a thickness of about 10 microns, whereas the second plate is of copper with a thickness of about 40 microns. The length of the first part is about 400 microns. As mechanical support a layer of Al is used; although any epoxy or other material is also suitable, this is suitable for various reasons. First of all the Al layer can be separated together with the copper layer. Secondly, the side of the first plate, that has been formed during the separation will be used as contact pad. With the double layer of Cu—Al a contact pad is provided with a size that is large enough for the provision of bumps of Au, Ag, Al or solder. Thirdly, the Cu—Al double layer is relatively elastic in comparison to a thick layer of Cu.

With this embodiment, as with others, it may be that the mask is applied to the first plate before the arrangement of the semiconductor device between the first and the second plate. For stability reasons it is then preferred that the first plate is temporarily attached to a mechanical support. This support can be an apparatus, but also a layer of a sacrificial material.

The second object of the invention is to provide a semiconductor device of the kind mentioned in the opening paragraph with a larger complexity, which is nevertheless of reduced size and which can be made simply.

This object is realized in that the device is provided with further elements, which elements are mutually interconnected by means of conducting tracks in the patterned first conductive plate. Due to the patterning of the first conductive plate it is very suitable to be used for wiring the one or more semiconductor elements and preferably the passive elements. The second plate may be of conducting material, but that is not necessary. If the second plate is of conducting material, it can be used as heat sink. The second plate may be patterned as well.

In a preferable embodiment, the semiconductor element is a transistor. However, it may be any other semidiscrete elements have more connection regions than two or even an integrated circuit or the like. The semiconductor device may for instance be a MMIC.

The pattern may have a resolution that is in the order of the thickness of the first and second plate, preferably of 2–40 microns. This allows to provide a variety of conducting tracks in the second plate, and nevertheless leave sufficient space for the connection regions, both for connection to the semiconductor elements and for connection to a carrier such as a printed circuit board.

The device is by preference manufactured on plate-level, e.g. a large number of semiconductor elements are arranged between the first and second plates, and are separated into individual semiconductor devices only after the provision of the encapsulation. This plate-level manufacture has as a first advantage that it substantially reduces the costs of assembly. Further on, it has the advantage that there are a plurality of semiconductor elements present to define the distance between the first and second plate: no additional spacers are necessary. Also if any of the other elements turns out to have a larger height than the semiconductor element, this is not problematic, unless the semiconductor element has a connection region to be electrically connected to the second plate. There will be a plurality of those elements, and each of those will act as a column between the first and the second plate. After the provision of the encapsulation, a mechanically stable stack has been realized that can be separated simply.

These and other aspects of the invention will be apparent from and elucidated with reference to the embodiment(s) described hereinafter.

In the drawings:

FIG. 1 diagrammatically shows, in a perspective and partly phantom view, a semiconductor device manufactured by means of a method in accordance with the invention, and FIGS. 2 through 5 are diagrammatic, cross-sectional views, in the thickness direction, taken along the line II—II in FIG. 1, of the device of FIG. 1 in successive stages of the manufacturing process by means of an embodiment of a method in accordance with the invention.

The Figures are not drawn to scale and some dimensions are exaggerated strongly for clarity. Wherever possible, corresponding areas or parts are indicated by means of the same reference numeral.

FIG. 1 diagrammatically shows a perspective and partly phantom view of a semiconductor device manufactured by means of a method in accordance with the invention. FIGS. 2 through 5 are diagrammatic, cross-sectional views, in the thickness direction, taken along the line II—II in FIG. 1, of the device of FIG. 1 in successive stages of the manufacturing process by means of an embodiment of a method in accordance with the invention.

Figure 2:
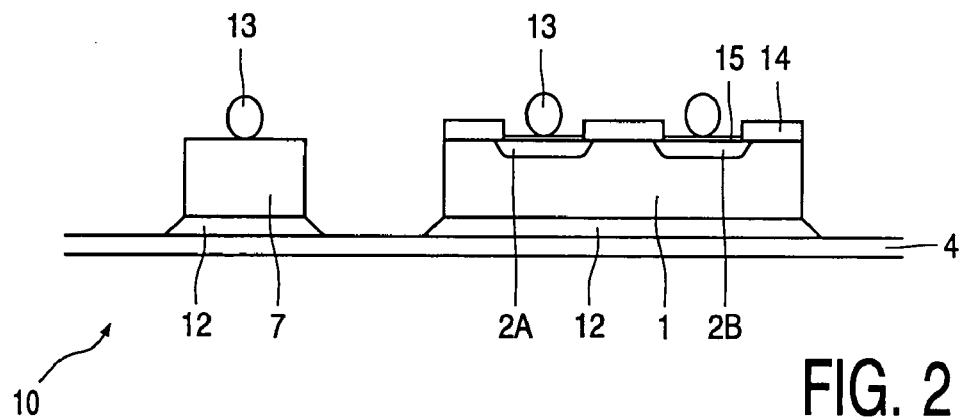
Figure 3:
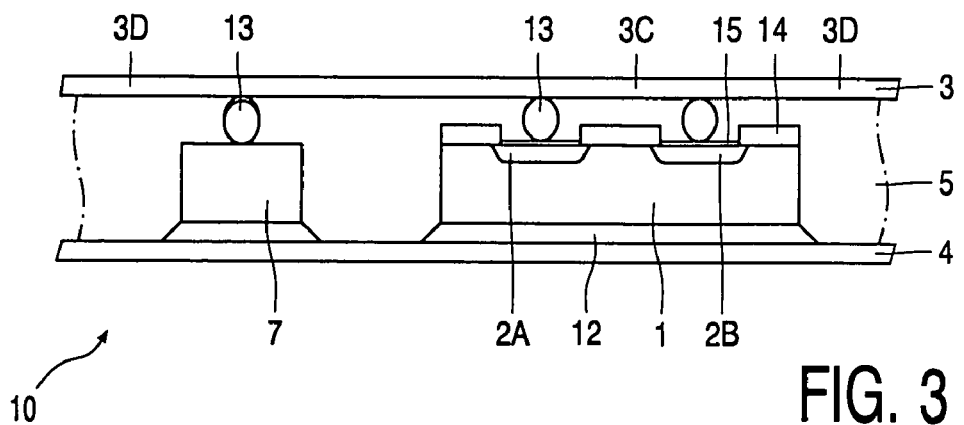

A device 10 (see FIG. 1) comprises a semiconductor element 1 that is provided with a number of connection regions 2, two of which (2A, 2B) are shown in FIG. 2, said semiconductor element being situated between a first and a second plate 3, 4 and is attached thereto: the lower side is attached to the second plate 4 by means of an electroconductive adhesive 12, and the upper side is attached to the first plate 3 by means of soldered joints 13 on the two connection regions 2A, 2B, which first plate 3, as well as the second plate 4 in this example, comprises a conductive material, in this case copper. A passivating encapsulation 5 is provided between the plates 3, 4 and around the semiconductor element 1. From the first conductive plate 3, two connection conductors 3A, 3B are formed for the semiconductor element 1, and the semiconductor device 10 is formed by means of sawing in two mutually perpendicular directions L, M. The dimensions of the device are 1.2 mm×0.8 mm, and the height is approximately 0.3 mm.

A method in accordance with the invention is employed to manufacture the device in the manner described hereinbelow (see FIGS. 2 through 5). First of all, the semiconductor element 1 is manufactured by means of customary semiconductor technology. The surface (see FIG. 2) is provided with an insulating layer 14 of silicon dioxide. The connection regions 2A, 2B situated at the surface are provided with a metal layer 15. Subsequently, the element 1 is adhered to a copper plate 4 having a thickness of, for example, 10 microns by means of a conductive adhesive 12. Next to the element 1, a conductive body 7 is adhered to the plate 4 in the same manner. The dimensions of element 1 and body 7, which is made of silicon or copper, are 0.3 mm×0.3 mm, and the height is approximately 0.25 mm. Next, spherical elements 13 of gold are provided on the element 1 as well as on the body 7.

Subsequently, (see FIG. 3) a conductive plate 3, also of copper, having the same thickness as the plate 4 is soldered onto the element 1 and the body 7. The dimensions of the plates 3, 4 are approximately 100 mm×100 mm and hence a large number of devices 10, in this case approximately 8000, can be simultaneously manufactured. Between the plates 3, 4 and around the element 1 and the body 7 a passivating synthetic resin 5 containing, in this case, an epoxy material is subsequently provided by means of injection molding or a filling technique.

Figure 4:
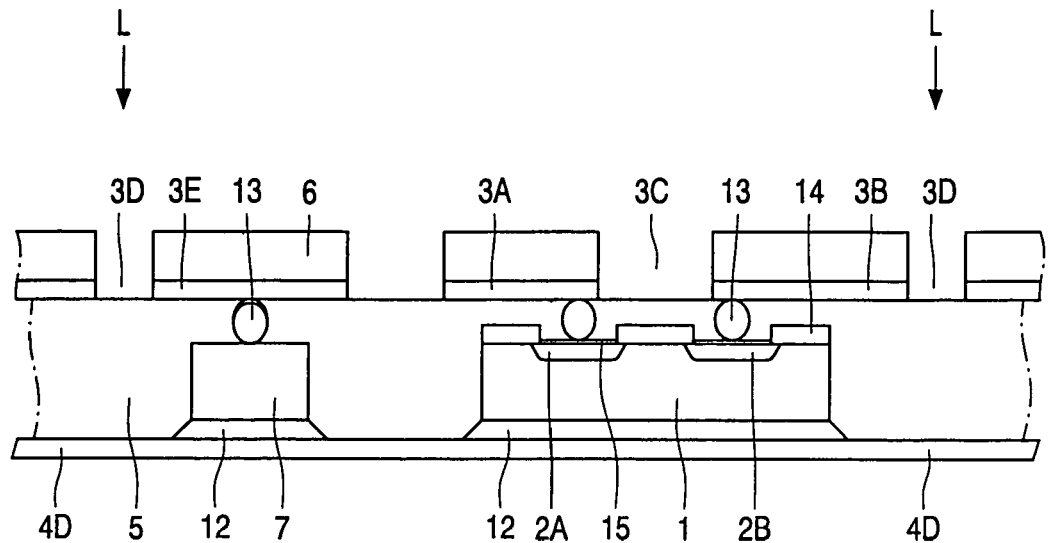
Figure 5:
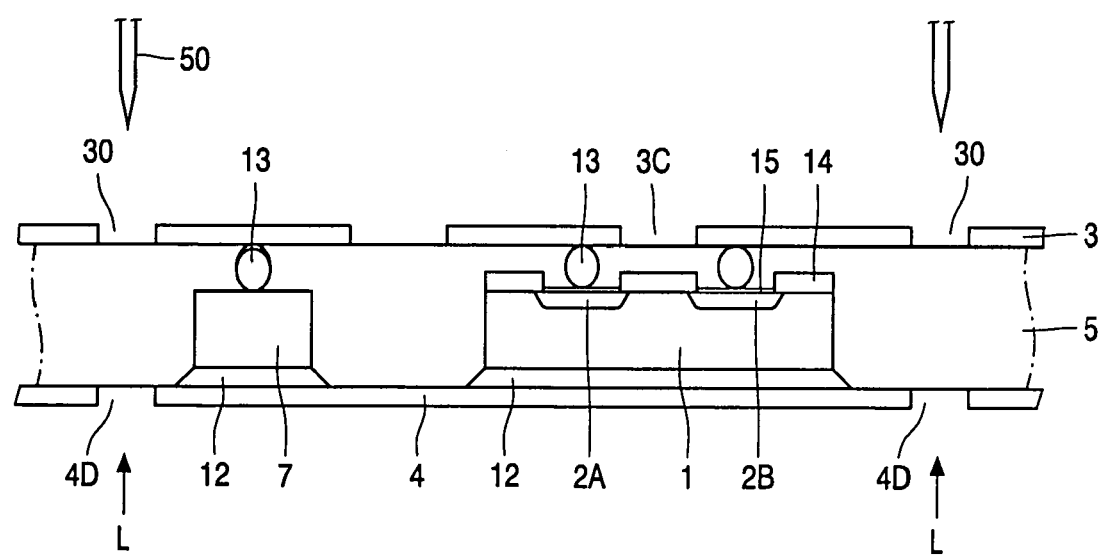

Subsequently, see FIG. 4, a solid photoresist layer 6 is provided in a thickness of, in this case, 5 microns onto the first plate 3. Said photoresist layer is provided with apertures by means of exposure using a suitable mask. Next, parts 3C, 3D are removed from the first plate 3 by means of etching using an etchant containing ammonium persulphate at an etching rate of 0.1 mm/min. The passivating encapsulation 5 serves here as an etch-stop layer 5. In this manner, connection conductors 3A, 3B, 3E for the element 1 and the body 7 are formed from the first plate 3. The shape and dimensions thereof are as indicated in FIG. 1 and are suitable for the silicon-containing transistor 10 intended in this example, which is intended to be used for signal amplification. Simultaneously, a part 3D is removed from the first plate 3 at the location where the device 10 to be formed is obtained, by means of a mechanical separating technique such as sawing in two mutually perpendicular directions L, M only the direction L of which is shown in FIGS. 2 through 5. In this manner, the device 10 is provided with a desired pattern of connection conductors 3A, 3B in a simple and inexpensive way. It is also achieved that during sawing the device 10, i.e. at least at the upper side thereof, it is sufficient to exclusively and directly saw through the passivating encapsulation 5, so that problems that arise if one and the same saw must be used for sawing through metal as well as synthetic resin are precluded.

If necessary, (see FIG. 5) also on the rear side of the device 10 to be formed, strip-shaped parts 4D are similarly removed from the second plate 4. As a result, only synthetic resin is sawn by means of the saw 50. After sawing in the two directions L, M, individual semiconductor devices 10 are obtained as shown in FIG. 1. These are suitable for surface mounting and are very compact as regards shape and dimensions. In this case, the body 7 enables the substrate of the element 1 to be electrically connected.

The invention is not limited to a method as described in the example, and, within the scope of the invention, many variations and modifications are possible to those skilled in the art. For example, devices having a different geometry and/or dimensions can be manufactured. It is also possible to use different materials, in particular, for the plates. It is further noted that small adaptations also enable an improved heat dissipation to be obtained.

It is expressly noted that apart from sawing also cutting or breaking can be used as the mechanical separating technique to form the individual semiconductor device. As regards the latter two techniques, in principle, substantially no loss of material is involved, whereas sawing causes the material at the location of a saw cut to be lost. In the manufacture of very small devices, as intended in the current invention, the loss of material due to sawing is comparatively large.

It is finally noted that additional elements or components can also be provided on one of the plates, for example on the first plate, by means of soldering, in which case the plate is provided with a suitable conductor pattern.

The invention claimed is:

1. A semiconductor device (10) comprising a semiconductor element (1), that is provided with a number of connection regions (2) and that is arranged between a first electrically conductive plate (3), and a second plate (3, 4), which first plate (3) is patterned into at least two connection conductors (3A, 3B), at least one of which is connected to the at least one connection region (2A, 2B) of the semiconductor element (1), between which first and second plates (3, 4) and around the semiconductor element (1) a passivating encapsulation (5) is present, characterized in that the device (10) is provided with further elements, which elements are mutually interconnected by means of conducting tracks in the patterned first conductive plate (3).

2. A semiconductor device as claimed in claim 1, wherein the semiconductor element is a transistor.

* * * * *